United States Patent
Maruyama et al.

(10) Patent No.: US 10,403,857 B2
(45) Date of Patent: Sep. 3, 2019

(54) CIRCULARLY POLARIZING PLATE AND BENDABLE DISPLAY DEVICE

(71) Applicant: FUJIFILM Corporation, Tokyo (JP)

(72) Inventors: Akira Maruyama, Kanagawa (JP); Yuta Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1 day.

(21) Appl. No.: 15/703,314

(22) Filed: Sep. 13, 2017

(65) Prior Publication Data

US 2018/0006275 A1    Jan. 4, 2018

Related U.S. Application Data

(63) Continuation of application No. PCT/JP2016/057635, filed on Mar. 10, 2016.

(30) Foreign Application Priority Data

Mar. 31, 2015    (JP) .................................. 2015-074056

(51) Int. Cl.
*H01L 51/52* (2006.01)
*G09F 9/30* (2006.01)
(Continued)

(52) U.S. Cl.
CPC ........ *H01L 51/5281* (2013.01); *G02B 5/3016* (2013.01); *G09F 9/30* (2013.01);
(Continued)

(58) Field of Classification Search
CPC ............. H01L 51/0097; H01L 51/5293; G02F 1/133528
See application file for complete search history.

(56) References Cited

U.S. PATENT DOCUMENTS

2002/0118323 A1  8/2002  Itou et al.
2004/0105059 A1  6/2004  Ohyama et al.
(Continued)

FOREIGN PATENT DOCUMENTS

CN    103250077 A    8/2013
JP    2002-258268 A   9/2002
(Continued)

OTHER PUBLICATIONS

Notification of Reason for Refusal issued by the Korean Intellectual Property Office dated Jun. 12, 2018, in connection with Korean Patent Application No. 10-2017-7026066.
(Continued)

*Primary Examiner* — Daniel Whalen
*Assistant Examiner* — Suberr L Chi
(74) *Attorney, Agent, or Firm* — Edwards Neils LLC; Jean C. Edwards, Esq.

(57) ABSTRACT

The present invention provides a circularly polarizing plate that makes it possible to realize a bendable display device having reduced reflectivity and reflective tint and has excellent bending resistance, and a display device including a circularly polarizing plate. The circularly polarizing plate of the present invention is a circularly polarizing plate used for a bendable display device and includes a polarizer, and a phase difference film that is arranged on one side of the polarizer. The phase difference film includes a λ/2 plate and a λ/4 plate, the λ/2 plate and the λ/4 plate each include a liquid crystal compound, and a slow axis direction of the phase difference film is adjusted to define an angle of 75 to 105 degrees with respect to a bending direction of the display device.

11 Claims, 4 Drawing Sheets

(51) Int. Cl.
*G02B 5/30* (2006.01)
*H01L 51/00* (2006.01)
*H05B 33/22* (2006.01)

(52) U.S. Cl.
CPC ......... *H01L 51/0097* (2013.01); *H05B 33/22* (2013.01); *H01L 2251/5338* (2013.01); *Y02E 10/549* (2013.01)

(56) References Cited

U.S. PATENT DOCUMENTS

| | | | |
|---|---|---|---|
| 2006/0068517 A1 | 3/2006 | Yu et al. | |
| 2006/0103796 A1 | 5/2006 | Kawamoto et al. | |
| 2012/0113338 A1* | 5/2012 | Saigusa | G02F 1/13363 349/25 |
| 2013/0249378 A1* | 9/2013 | Murakami | C08J 5/18 313/112 |
| 2015/0253480 A1* | 9/2015 | Ren | C08L 1/10 359/489.07 |
| 2015/0369981 A1 | 12/2015 | Takeda et al. | |
| 2017/0261668 A1* | 9/2017 | Hatano | G02B 5/3025 |

FOREIGN PATENT DOCUMENTS

| | | |
|---|---|---|
| JP | 2003-322857 A | 11/2003 |
| JP | 2006-091825 A | 4/2006 |
| JP | 2006-163343 A | 6/2006 |
| JP | 2014-170221 A | 9/2014 |
| KR | 10-2010-0099091 A | 9/2010 |
| WO | 2014/123038 A1 | 8/2014 |

OTHER PUBLICATIONS

Notification of Reasons for Refusal issued by the Japanese Patent Office dated Oct. 2, 2018, in connection with Japanese Patent Application No. 2017-509488.
International Search Report issued in PCT/JP2016/057635 dated May 31, 2016.
Written Opinion issued in PCT/JP2016/057635 dated May 31, 2016.
International Preliminary Report on Patentability completed by WIPO dated Apr. 17, 2017, in connection with International Patent Application No. PCT/JP2016/057635.
Notice of Final Rejection, issued by the Korean Intellectual Property Office dated Jan. 28, 2019, in connection with Korean Patent Application No. 10-2017-7026066.
Notice of Reasons for Refusal, issued by the Korean Intellectual Property Office dated May 5, 2019, in connection with Korean Patent Application No. 10-2017-7026066.
Office Action issued by the State Intellectual Property Office of People's Republic of China dated Jun. 12, 2019 in connection with Chinese Patent Application No. 201680019718.2.

* cited by examiner

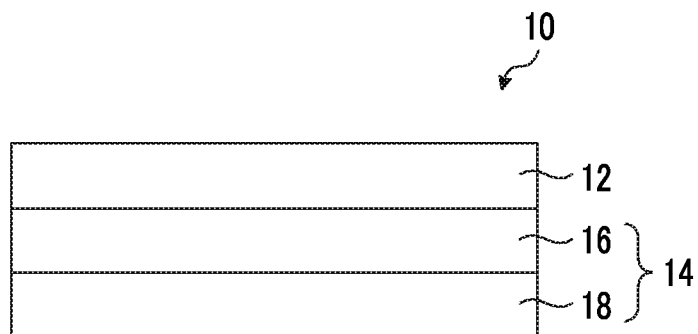
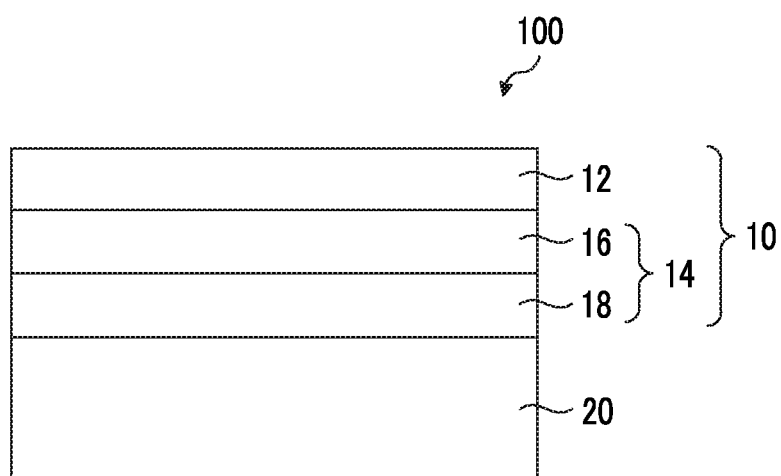

CIRCULARLY POLARIZING PLATE AND BENDABLE DISPLAY DEVICE

CROSS-REFERENCE TO RELATED APPLICATIONS

This application is a Continuation of PCT International Application No. PCT/JP2016/057635 filed on Mar. 10, 2016, which was published under PCT Article 21(2) in Japanese, and which claims priority under 35 U.S.C. § 119(a) to Japanese Patent Application No. 2015-074056 filed on Mar. 31, 2015. The above applications are hereby expressly incorporated by reference, in their entirety, into the present application.

BACKGROUND OF THE INVENTION

1. Field of the Invention

The present invention relates to a circularly polarizing plate and a bendable display device including a circularly polarizing plate.

2. Description of the Related Art

Conventionally, in order to suppress adverse effects caused by reflection of external light, a circularly polarizing plate has been used for a display device.

On the other hand, in recent years, there has been an increasing demand for making an image display element, represented by an organic electroluminescence (EL) element, flexible (bendable). Further, there has been a demand for not just realization of flexibilization but realization of flexibilization at a very small radius of curvature.

However, in a case in which an organic EL display device is bent at a very small radius of curvature, a great force is applied to a phase difference film of a circularly polarizing plate (a tensile force is applied to some parts and a compressive force is applied to other parts), a phase difference in the parts is changed.

In JP2014-170221A, in order to solve the above problem, there is provided a circularly polarizing plate including a phase difference film exhibiting predetermined optical properties, in which a slow axis direction of the phase difference film is adjusted to define an angle of 20 to 70 degrees with respect to a bending direction of a display device. In JP2014-170221A, as the phase difference film exhibiting predetermined optical properties, a resin film such as PURE-ACE WR (polycarbonate resin film) is used.

SUMMARY OF THE INVENTION

On the other hand, in recent years, it has been required to further improve the visibility of a display device and it has been also required to further reduce the reflectivity and the reflective tint at a bent portion in a case in which a bendable display device is bent.

In addition, it is necessary for a circularly polarizing plate to be applied to a bendable display device to follow the bent portion of the display device and in a case in which the circularly polarizing plate is bent, it is required for the circularly polarizing plate to hardly have cracking, that is, to have excellent bending resistance. Particularly, in a case in which the circularly polarizing plate is wound around a rod having a small radius of curvature, it is preferable that the circularly polarizing plate has excellent bending resistance (cracking hardly occurs).

When the present inventors have conducted an investigation on characteristics of the circularly polarizing plate described in JP2014-170221A, all of the above demands cannot be satisfied at the same time and further improvement has been required.

The present invention has been made in consideration of the above circumstances and an object thereof is to provide a circularly polarizing plate that makes it possible to realize a bendable display device having reduced reflectivity and reflective tint and has excellent bending resistance.

Another object of the present invention is to provide a display device including the circularly polarizing plate.

As a result of conducting intensive investigations on the problems in the related art, the present inventors have found that the above problems can be solved by using a phase difference film including a liquid crystal compound and adjusting a slow axis direction of the phase difference film and a bending direction of a display device to form a predetermined angle.

That is, it has been found that the above objects can be achieved by adopting the following configurations.

(1) A circularly polarizing plate used for a bendable display device, comprising:
a polarizer; and a phase difference film that is arranged on one side of the polarizer,
in which the phase difference film includes a λ/2 plate and a λ/4 plate,
the λ/2 plate and the λ/4 plate each include a liquid crystal compound, and
a slow axis direction of the phase difference film is adjusted to define an angle of 75 to 105 degrees with respect to a bending direction of the display device.

(2) The circularly polarizing plate according to (1), in which the slow axis direction of the phase difference film is adjusted to define an angle of 80 to 100 degrees with respect to the bending direction of the display device.

(3) The circularly polarizing plate according to (1) or (2), in which the phase difference film further includes a positive C-plate having a retardation in a thickness direction at a wavelength of 550 nm of −150 to −50 nm.

(4) The circularly polarizing plate according to any one of (1) to (3), in which the display device is an organic electroluminescence display device.

(5) A bendable display device comprising: the circularly polarizing plate according to any one of (1) to (4).

According to the present invention, it is also possible to provide a circularly polarizing plate that makes it possible to realize a bendable display device having reduced reflectivity and reflective tint and has excellent bending resistance.

According to the present invention, it is also possible to provide a display device including the circularly polarizing plate.

BRIEF DESCRIPTION OF THE DRAWINGS

FIG. 1 is a cross-sectional view showing an embodiment of a circularly polarizing plate of the present invention.

FIG. 2 is a cross-sectional view showing an embodiment of a display device of the present invention.

DESCRIPTION OF THE PREFERRED EMBODIMENTS

Figure 3A:
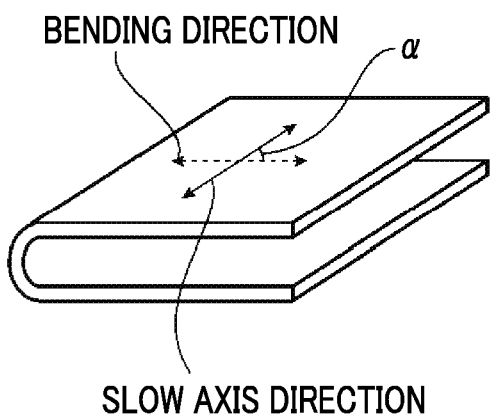
FIG. 3A is a schematic view illustrating an embodiment in which the display device of the present invention is bent.
Figure 3B:
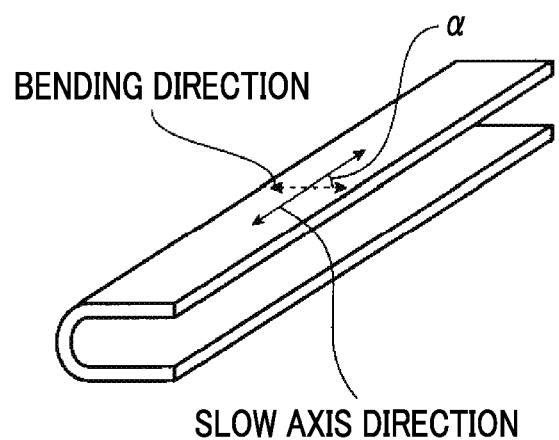
FIG. 3B is a schematic view illustrating an embodiment in which the display device of the present invention is bent.
Figure 3C:
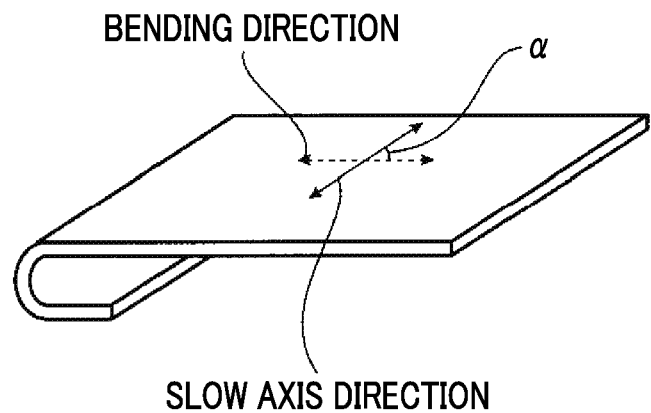
FIG. 3C is a schematic view illustrating an embodiment in which the display device of the present invention is bent.
Figure 3D:
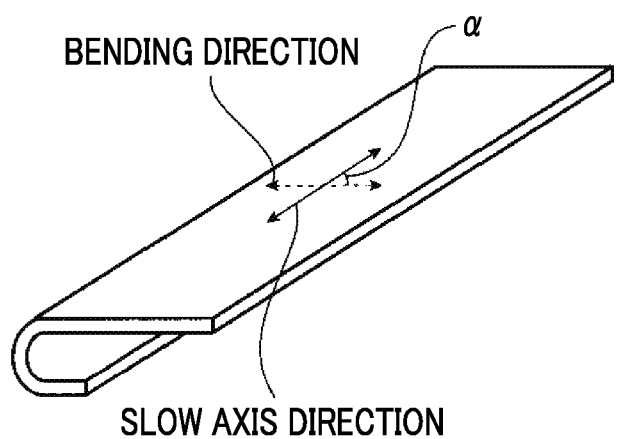
FIG. 3D is a schematic view illustrating an embodiment in which the display device of the present invention is bent.

The present invention will be hereunder described in detail. The following description of the constitutional requirements is made on the basis of representative embodiments of the present invention, but it should not be construed that the present invention is limited to those embodiments. In present specification, numerical value ranges expressed by the term "to" mean that the numerical values described before and after "to" are included as a lower limit and an upper limit, respectively.

In addition, it is defined that the terms "perpendicular" and "parallel" with respect to angle mean ranges expressed by precise angle ±10 degrees, and the terms "equal" and "different" with respect to angle can be determined based on a criterion that whether the difference is less than 5 degrees or not.

In the present specification, the term "visible light" refers to light in a wavelength range of 380 to 780 nm. Further, in the present specification, the measurement wavelength is 550 nm unless otherwise specified regarding the measurement wavelength.

In the present specification, the term "slow axis direction" refers to a direction in which a refractive index becomes maximum in a plane. In a case of mentioning a slow axis of a phase difference film, the slow axis in this case means the slow axis of the entire phase difference film.

The term "circularly polarizing plate" includes both a long circularly polarizing plate and a circularly polarizing plate which is cut into a size that can be incorporated in a display device unless otherwise specified. The term "cutting" used herein includes "punching", "slicing", and the like.

In the present specification, the term "tilt angle" means an angle that is formed between a tilted liquid crystal compound and the plane of layer, and means a largest angle out of angles formed between the direction of maximum refractive index and the plane of layer in a refractive index ellipsoid of the liquid crystal compound. Accordingly, as for a rod-like liquid crystal compound having a positive optical anisotropy, the tilt angle means an angle formed between the longitudinal direction of the rod-like liquid crystal compound, that is, the direction of a director, and the plane of layer. In the present invention, the "average tilt angle" means an average value of the tilt angles observed at the upper interface and the lower interface of the optically anisotropic layer.

In the present specification, Re(λ) and Rth(λ) represent the in-plane retardation at a wavelength λ and the retardation in a thickness direction, respectively. Re(λ) is measured by applying light having a wavelength of λ nm to a film in the normal direction of the film, in KOBRA 21ADH or WR (product name, manufactured by Oji Scientific Instruments).

In the case in which the film to be measured is one expressed by a uniaxial or biaxial index ellipsoid, Rth(λ) is calculated by the following method.

Rth(λ) is measured in the following manner. Re(λ) is measured at six points in total by making light having a wavelength of λ nm incident on the film in the directions tilted from the normal direction of the film with the in-plane slow axis (which is determined with KOBRA 21ADH or WR) as the tilt axis (rotation axis) (in the case in which there is no slow axis, an arbitrary in-plane direction of the film is used as the rotation axis) to 50 degrees on one side of the film in the normal direction with a step of 10 degrees, and Rth(λ) is calculated by KOBRA 21ADH or WR based on the retardation values thus measured, the assumed value of the average refractive index, and the input film thickness value.

In the above description, in a case of a film that has a direction in which the retardation value thereof is zero at a certain tilt angle relative to the in-plane slow axis thereof in the normal direction taken as a rotation axis, the retardation value at a tilt angle larger than the tilt angle is converted into the corresponding negative value and then calculated by KOBRA 21ADH or WR.

Additionally, with the slow axis taken as the tilt axis (rotation axis) (in the case in which the film does not have a slow axis, an arbitrary in-plane direction of the film may be taken as the rotation axis), the retardation values are measured in two arbitrary tilted directions and, based on the above values, the assumed value of average refractive index, and the inputted film thickness, Rth can be also calculated according to Expressions (1) and (2).

$$Re(\theta) = \left[nx - \frac{(ny \times nz)}{\sqrt{\left\{ny\sin\left(\sin^{-1}\left(\frac{\sin(-\theta)}{nx}\right)\right)\right\}^2 + \left\{ny\sin\left(\sin^{-1}\left(\frac{\sin(-\theta)}{nx}\right)\right)\right\}^2}}\right] \times \frac{d}{\cos\left\{\sin^{-1}\left(\frac{\sin(-\theta)}{nx}\right)\right\}} \quad \text{Expression (1)}$$

$$Rth = \left(\frac{nx + ny}{2} - nz\right) \times d \quad \text{Expression (2)}$$

In the expressions, Re(θ) represents a retardation value in a direction tilted by an angle θ from the normal direction. nx represents a refractive index in the in-plane slow axis direction, ny represents a refractive index in the in-plane direction perpendicular to nx, and nz represents a refractive index in the direction perpendicular to nx and ny. d represents a film thickness.

In the case in which the film to be measured cannot be expressed by a uniaxial or biaxial index ellipsoid, that is, the film that does not have a so-called optical axis, Rth(λ) is calculated according to the following method.

Rth(λ) is measured in the following method. Re(λ) is measured at eleven points by making light having a wavelength of λ nm incident on the film in each of the tilt directions of from −50 degrees to +50 degrees with a step of 10 degrees with respect to the normal direction of the film with the in-plane slow axis (which is determined with KOBRA 21ADH or WR) as a tilt axis (rotation axis), and Rth(λ) is calculated KOBRA 21ADH or WR based on the retardation values thus measured, the assumed value of the average refractive index, and the input film thickness value.

In the above measurements, the assumed value of the average refractive index may be the values shown in Polymer Handbook (JOHN WILEY & SONS, INC) and the brochures of various optical films. For the film with an unknown average refractive index, the film may be measured for the average refractive index with an Abbe refractometer. Examples of the average refractive indices of the major optical films are shown below; cellulose acylate (1.48), cycloolefin polymer (1.52), polycarbonate (1.59), polymethyl methacrylate (1.49), and polystyrene (1.59). In a case where the assumed value of the average refractive index and the film thickness are inputted, the values of nx, ny and nz are calculated by KOBRA 21ADH or WR. The expression of Nz=(nx−nz)/(nx−ny) is further calculated based on the calculated values of nx, ny and nz.

In the present specification, the definition of C-plate is as follows.

There are two kinds of C-plates; a positive C-plate and a negative C-plate. The positive C-plate satisfies the relationship of Expression (C1), and the negative C-plate satisfies the relationship of Expression (C2). Rth of the positive C-plate has a negative value and Rth of the negative C-plate has a positive value.

nz>nx≅ny  Expression (C1)

nz<nx≅ny  Expression (C2)

The term "≅" includes not only the case in which both are completely the same but also the case in which both are substantially the same. Regarding the term "substantially the same", for example, "nx≅ny" includes the case in which (nx−ny)×d (wherein d is a film thickness) is 0 to 10 nm and preferably 0 to 5 nm.

One feature of the present invention is that the slow axis direction of the phase difference film and the bending direction of the display device are controlled by using a phase difference film having λ/2 plate including a liquid crystal compound and a λ/4 plate including a liquid crystal compound.

In JP2014-170221A, it is disclosed a resin film represented by a polycarbonate resin film is used and that it is preferable that the slow axis direction of the phase difference film and the bending direction of the display device form a predetermined angle (20 to 70 degrees).

On the other hand, in the present invention, a phase difference film including a liquid crystal compound is used. When the present inventors have conducted an investigation, it has been found that, in a case of using the phase difference film including a liquid crystal compound, the effect can further improved in the range of the relationship between the slow axis direction of the phase difference film and the bending direction of the display device that is different from the range of the relationship between the slow axis direction of the phase difference film and the bending direction of the display device of JP2014-170221A. Although the detailed reasons are unknown, it is assumed that this is because the constitutional materials of the phase difference films or the layer configurations of the phase difference film are different.

A circularly polarizing plate having a phase difference film including a liquid crystal compound has excellent bending resistance (property that cracking hardly occurs at the time of bending).

Hereinafter, an embodiment of a circularly polarizing plate of the present invention will be described with reference to drawings. FIG. 1 is a cross-sectional view showing an embodiment of a circularly polarizing plate according to the present invention. The drawings in the present invention are schematic and not always identical to actual ones in terms of the thickness relationship and positional relationship of each layer. The same is applied to the followings.

A circularly polarizing plate 10 includes a polarizer 12 and a phase difference film 14 that is arranged on one surface of the polarizer 12, and the phase difference film 14 includes a λ/2 plate 16 and λ/4 plate 18 from the polarizer 12 side. That is, the circularly polarizing plate 10 includes the polarizer 12, the λ/2 plate 16, and the λ/4 plate 18 in this order. The phase difference film 14 has characteristics of a so-called λ/4 plate (a phase difference film exhibiting a ¼ phase difference value with respect to each wavelength). In addition, the circularly polarizing plate 10 is arranged such that the polarizer 12 is disposed on a viewing side in a case in which the circularly polarizing plate is arranged on a display element.

Hereinafter, first, each member included in the circularly polarizing plate will be described in detail.

<Polarizer>

The polarizer may be a member having a function of converting light into specific linearly polarized light (linear polarizer) and an absorptive type polarizer can be mainly used.

As the absorptive type polarizer, an iodine-based polarizer, a dye-based polarizer using a dichroic dye, a polyene-based polarizer, and the like are used. The iodine-based polarizer and the dye-based polarizer are a coating type polarizer and a stretching type polarizer, and any one of these polarizers can be applied. Among these, a polarizer, which is prepared by allowing polyvinyl alcohol to adsorb iodine or a dichroic dye, and performing stretching, is preferable.

In addition, examples of a method of obtaining a polarizer by performing stretching and dyeing in a state of a laminated film in which a polyvinyl alcohol layer is formed on a substrate include methods disclosed in JP5048120B, JP5143918B, JP5048120B, JP4691205B, JP4751481B, and JP4751486B, and known technologies related to these polarizers can be preferably used.

Among these, from the viewpoint of handleability, a polarizer containing a polyvinyl alcohol-based resin (a polymer including —$CH_2$—CHOH— as a repeating unit, in particular, at least one selected from the group consisting of polyvinyl alcohol and an ethylene-vinyl alcohol copolymer is preferable) is preferable.

The thickness of the polarizer is not particularly limited but from the viewpoint of achieving excellent handleability and excellent optical properties, the thickness is preferably 35 μm or less and more preferably 3 to 25 μm. Within the thickness range, a display device can be made thin.

<λ/2 Plate>

The λ/2 plate is a layer included in the phase difference film and is a layer positioned between the polarizer and a display element as described in detail later.

The λ/2 plate refers to an optically anisotropic layer of which the in-plane retardation Re(λ) at a predetermined wavelength λ nm satisfies Re(λ)=λ/2. This expression may be satisfied at a wavelength in a visible light range (for example, 550 nm). In this range, it is preferable that the in-plane retardation Re(550) at a wavelength of 550 nm satisfies the relationship.

210 nm≤Re(550)≤300 nm

In the relationship, it is more preferable that a relationship of 220 nm≤Re(550)≤290 nm is satisfied.

An angle formed between the slow axis of the λ/2 plate and the transmission axis of the polarizer is preferable in a range of 15±10 degrees, more preferably in a range of 15±8 degrees, and even more preferably in a range of 15±5 degrees.

The angle means an angle formed between the slow axis of the λ/2 plate and the transmission axis of the polarizer in a case of being viewed in the normal direction of the surface of the polarizer.

Rth(550) which is a retardation value of the λ/2 plate in the thickness direction measured at a wavelength of 550 nm is preferably −150 to 150 nm and more preferably −100 to 100 nm from the viewpoint of further improving the effect of the present invention.

Although the thickness of the λ/2 plate is not particularly limited, the thickness thereof is 0.5 to 10 μm and more preferably 0.5 to 5 μm from the viewpoint of thinning.

The thickness means the average thickness and is obtained by measuring the thicknesses at 5 points of the λ/2 plate and averaging the measured values.

The λ/2 plate includes a liquid crystal compound.

The type of liquid crystal compound is not particularly limited but liquid crystal compounds can be classified into a rod-shaped type (rod-like liquid crystal compound) and a disk-shaped type (disk-like liquid crystal compound, discotic liquid crystal compound) on the basis of the shape thereof. Further, each type includes a low molecular type and a high molecular type. A high molecule generally indicates a molecule having a polymerization degree of 100 or more (Masao Doi; Polymer Physics-Phase Transition Dynamics, 1992. IWANAMI SHOTEN, PUBLISHERS, page 2). In the present invention, any type of liquid crystal compound can be used. A mixture of two types or more of rod-like liquid crystal compounds, two types or more of disk-like liquid crystal compounds, or a rod-like liquid crystal compound and a disk-like liquid crystal compound may be used.

As the rod-like liquid crystal compound, for example, it is possible to preferably use those described in claim 1 of JP1999-513019A (JP-H11-513019A) or in paragraphs [0026] to [0098] of JP2005-289980A. As the discotic liquid crystal compound, for example, it is possible to preferably use those described in paragraphs [0020] to [0067] of JP2007-108732A or in paragraphs [0013] to [0108] of JP2010-244038A.

It is more preferable to form the λ/2 plate using a liquid crystal compound (rod-like liquid crystal compound or disk-like liquid crystal compound) having a polymerizable group since changes in temperature and humidity in optical properties can be made small. The liquid crystal compound may be a mixed compound of two or more types. In this case, it is preferable that at least one has two or more polymerizable groups.

That is, it is preferable that the λ/2 plate is a layer formed by fixing a rod-like liquid crystal compound having a polymerizable group or a disk-like liquid crystal compound having a polymerizable group through polymerization. In this case, after the layer is formed, the liquid crystal compound does not need to exhibit liquid crystallinity.

The type of polymerizable group included in the rod-like liquid crystal compound or the disk-like liquid crystal compound is not particularly limited and a functional group capable of causing an addition polymerization reaction is preferable. A polymerizable ethylenically unsaturated group or a cyclic polymerizable group is preferable. More specifically, a (meth)acryloyl group, a vinyl group, a styryl group, and an allyl group are preferable and a (meth)acryloyl group is more preferable. The (meth)acryloyl group is a concept including both a methacryloyl group and an acryloyl group.

The method of forming the λ/2 plate is not particularly limited and a known method may be used.

For example, a coating film is formed by applying an optically anisotropic layer forming composition including a liquid crystal compound having a polymerizable group (hereinafter, also simply referred to as "composition") to a predetermined substrate (including a temporary substrate) and the obtained coating film is subjected to a curing treatment (irradiation with ultraviolet rays (light irradiation treatment) or heating treatment) so that an λ/2 plate can be produced. If required, an alignment layer, which will be described later, may be used.

The composition can be applied by a known method (for example, a wire bar coating method, an extrusion coating method, a direct gravure coating method, a reverse gravure coating method, or a die coating method).

The composition may include components other than the above liquid crystal compound.

For example, the composition may include a polymerization initiator. The polymerization initiator to be used is selected according to the polymerization reaction mode and examples thereof include a thermal polymerization initiator and a photopolymerization initiator. Examples of the photopolymerization initiator include an α-carbonyl compound, acyloin ether, an α-hydrocarbon-substituted aromatic acyloin compound, a polynuclear quinone compound, and a combination of triaryl imidazole dimer and p-aminophenylketone.

The amount of the polymerization initiator used is preferably 0.01% to 20% by mass and more preferably 0.5% to 5% by mass with respect to the total solid content of the composition.

In addition, the composition may include a polymerizable monomer from the viewpoint of evenness of a coating film and film strength.

Examples of the polymerizable monomer include a radical polymerizable or a catatonical polymerizable compound. Preferable is a polyfunctional radical polymerizable monomer. As the polymerizable monomer, a monomer copolymerizable with the liquid crystal compound having a polymerizable group is preferable. For example, those described in paragraphs [0018] to [0020] of JP2002-296423A may be used.

The amount of the polymerizable monomer used is preferably 1% to 50% by mass and more preferably 2% to 30% by mass with respect to the total mass of the liquid crystal compound.

In addition, the composition may include a surfactant from the viewpoint of evenness of a coating film and film strength.

As the surfactant, a conventionally known compound may be used and a fluorine-based compound is particularly preferable. Specific examples thereof include compounds described in paragraphs [0028] to [0056] of JP2001-330725A, and compounds described in paragraphs [0069] to [0126] of JP2003-295212A.

In addition, the composition may include a solvent and an organic solvent is preferably used. Examples of the organic solvent include amides (for example, N,N-dimethylformamide), sulfoxides (for example, dimethylsulfoxide), heterocyclic compounds (for example, pyridine), hydrocarbons (for example, benzene, hexane), alkyl halides (for example, chloroform, and dichloromethane), esters (for example, methyl acetate, ethyl acetate, and butyl acetate), ketones (for example, acetone, and methyl ethyl ketone), and ethers (for example, tetrahydrofuran, and 1,2-dimethoxyethane). Among these, alkyl halides and ketones are preferable. These organic solvents may be used alone or in combination of two or more thereof.

In addition, the composition may include various aligning agents such as a vertical alignment promoter, such as a polarizer interface side vertical aligning agent or an air interface side vertical aligning agent, and a horizontal alignment promoter, such as a polarizer interface side horizontal aligning agent or an air interface side horizontal aligning agent.

Further, the composition may include an adhesion improver, a plasticizer, a polymer and the like, in addition to the above components.

<λ/4 Plate (λ/4 Wavelength Plate)>

The λ/4 plate is a layer included in the phase difference film and is a layer positioned between the polarizer and a display element.

The λ/4 plate (a plate having a λ/4 function) is a plate having a function of converting linearly polarized light having a specific wavelength into circularly polarized light (or circularly polarized light into linearly polarized light). Specifically, the λ/4 plate refers to a plate of which the in-plane retardation Re(λ) at a specific wavelength λ nm satisfies Re(λ) a λ/4 (or odd times thereof). This expression may be satisfied at a wavelength in a visible light range (for example, 550 nm) but it is preferable that the in-plane retardation Re(550) at a wavelength of 550 nm satisfies the following relationship.

$$100 \text{ nm} \leq Re(550) \leq 160 \text{ nm}$$

In the relationship, it is more preferable that a relationship of $110 \text{ nm} \leq Re(550) \leq 150 \text{ nm}$ is satisfied.

An angle θ formed between the slow axis of the λ/4 plate and the slow axis of the λ/2 plate is preferably in a range of 60±10 degrees, more preferably in a range of 60±8 degrees, and even preferably in a range of 60±5 degrees.

The angle means an angle formed between the slow axis of the λ/4 plate and the slow axis of the λ/2 plate in a case of being viewed in the normal direction of the surface of the polarizer.

Rth(550) which is a retardation value of the λ/4 plate in the thickness direction measured at a wavelength of 550 nm is preferably −120 to 120 nm and more preferably −80 to 80 nm from the viewpoint of further improving the effect of the present invention.

Although the thickness of the λ/4 plate is not particularly limited, the thickness thereof is 0.5 to 10 μm and more preferably 0.5 to 5 μm from the viewpoint of thinning.

The thickness means the average thickness and is obtained by measuring the thicknesses at 5 points of the λ/4 plate and averaging the measured values.

The λ/4 plate includes a liquid crystal compound. The definition of the liquid crystal compound is as described above. Among these, the λ/4 plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity.

<Other Layers>

The circularly polarizing plate may include layers other than the polarizer and the phase difference film, within a range not impairing the effect of the present invention.

Further, the phase difference film may include layers other than the λ/2 plate and the λ/4 plate, within a range not impairing the effect of the present invention. The following arbitrary other layers will be described in detail.

(Positive C-Plate (Also Referred to as Optically Anisotropic Layer C))

The phase difference film (or the circularly polarizing plate) may further include a positive C-plate of which the retardation (Rth(550)) in the thickness direction at a wavelength of 550 nm is −150 to −50 nm. Since the phase difference film includes the positive C-plate, the reflectivity and reflective tint of the display device can be further suppressed.

The retardation (Rth(550)) of the positive C-plate in the thickness direction at a wavelength of 550 nm is −150 to −50 nm, preferably −130 to −70 nm, and more preferably −120 to −80 nm.

Although the thickness of the positive C-plate is not particularly limited, the thickness thereof is preferably 0.5 to 10 μm and more preferably 0.5 to 5 μm from the viewpoint of thinning.

The thickness means the average thickness and is obtained by measuring the thicknesses at 5 points of the positive C-plate and averaging the measured values.

Although a material for constituting the positive C-plate is not particularly limited, it is preferable that the material includes a liquid crystal compound. The definition of the liquid crystal compound is as described above. Among these, the positive C-plate is preferably a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity.

(Alignment Layer)

The phase difference film may include an alignment film having a function of determining the alignment direction of the liquid crystal compound.

The alignment film has generally a polymer as a main component. The polymer materials for the alignment film are mentioned in a large number of literatures, and a large number of commercial products are available. The polymer material used is preferably polyvinyl alcohol or polyimide, and derivatives thereof. Particularly, modified or unmodified polyvinyl alcohols are preferable. Regarding the alignment film that can be used in the present invention, the modified polyvinyl alcohols described in WO01/88574A1, from page 43, line 24 to page 49, line 8, and paragraphs [0071] to [0095] of JP3907735B can be referred to. The alignment film is typically subjected to a known rubbing treatment. That is, the alignment film is preferably a rubbed alignment film which is subjected to a rubbing treatment.

Although the thickness of the alignment layer is not particularly limited, the thickness thereof is 20 μm or less in most cases and in this range, the thickness is preferably 0.01 to 10 μm, more preferably 0.01 to 5 μm, and even more preferably 0.01 to 1 μm.

(Polarizer Protective Film)

A polarizer protective film may be arranged on the surface of the polarizer. The polarizer protective film may be arranged on only one surface of the polarizer (on the surface on the side opposite to the phase difference film side) and may be arranged on both surfaces of the polarizer.

The configuration of the polarizer protective film is not particularly limited. The polarizer protective film may be, for example, a so-called transparent support, a hard coat layer, or a laminate of a transparent support and a hard coat layer.

As the hard coat layer, a known layer can be used and for example, a layer obtained by polymerizing and curing a polyfunctional monomer may be used.

As the transparent support, a known transparent support can be used and for example, as the material for constituting the transparent support, a cellulose-based polymer (hereinafter, referred to as cellulose acylate) typified as triacetyl cellulose and a thermoplastic norborene-based resin (ZEONEX and ZEONOR, manufactured by Zeon Corporation, ARTON, manufactured by JSR Corporation, or the like), an acrylic resin, and a polyester-based resin may be used.

Although the thickness of the polarizer protective film is not particularly limited, the thickness thereof is preferably 40 µm or less and more preferably 25 µm or less since the thickness of the polarizing plate can be reduced.

In addition, in order to secure adhesiveness between each layer, an adhesive layer or a pressure sensitive adhesive layer may be arranged between each layer. Further, the transparent support may be arranged between each layer.

<Circularly Polarizing Plate>

The circularly polarizing plate of the present invention has the above-described polarizer and phase difference film.

Although the thickness (entire thickness) of the circularly polarizing plate is not particularly limited, from the viewpoint of thinning, the thickness thereof is preferably 200 µm or less, more preferably 150 µm or less, and even more preferably 120 µm. The lower limit is not particularly limited and is typically 20 µm or more in most cases.

The thickness of the circularly polarizing plate is measured using a contact-type film thickness measuring meter (manufactured by Anritsu Corporation), and an average value obtained by measuring the thicknesses at 5 points with equal intervals and averaging the measured values is used.

The slow axis direction of the phase difference film in the circularly polarizing plate satisfies a predetermined angular relationship with the bending direction of the display device as described in detail later.

The slow axis direction of the phase difference film means the slow axis of the entire phase difference film and for example, in a case in which the phase difference film is formed of two layers of λ/2 plate and λ/4 plate, the slow axis direction means the slow axis of the laminate of these layers.

In a case in which the phase difference film includes layers other than the λ/2 plate and the λ/4 plate (for example, positive C-plate, alignment film), the slow axis direction means the slow axis of the entire phase difference film including these layers.

<Display Device>

The circularly polarizing plate of the present invention is used for a bendable display device.

Specific examples of the bendable display device include an organic EL display device, a liquid crystal display device using a circularly polarizing plate (representatively, vertical alignment (VA) mode liquid crystal display device), and a micro electro mechanical systems (MEMS) display. The bendable display device to which the circularly polarizing plate of the present invention is particularly suitably applied is an organic EL display device.

A suitable embodiment of the display device of the present invention is an organic EL display device. FIG. 2 is a cross-sectional view showing an embodiment of a display device of the present invention and is specifically a cross-sectional view of an organic EL display device. An organic EL display device 100 includes an organic EL element 20, and the circularly polarizing plate 10 that is arranged on a viewing side of the organic EL element 20. The circularly polarizing plate is the above-described circularly polarizing plate of the present invention. In the circularly polarizing plate, the phase difference film 14 is laminated such that the phase difference film is disposed on the organic EL element side (the polarizer 12 is disposed on the viewing side).

In the case of the embodiment, external light is converted into linearly polarized light by the polarizer and then passes through the phase difference film to be converted into circularly polarized light. The circularly polarized state is reversed in a case in which this light is reflected by the metal electrode or the like of the organic EL element and becomes linearly polarized light inclined at 90 degrees when light is incident in a case in which the light passes through the phase difference film again, and the light is absorbed when reaching the polarizer. As a result, the effect of external light can be suppressed.

In a case in which the circularly polarizing plate is produced, for example, it is preferable to include a step of continuously laminating the polarizer and the phase difference film in long length respectively. The long circularly polarizing plate is cut according to the size of a screen of an image display device to be used.

In addition, the details of the bendable organic EL display device are described in, for example, JP4601463B or JP4707996B. These descriptions are adopted in the present specification by reference.

The embodiment in which the organic EL element is used has been described above. However, the present invention is not limited to the embodiment. The display device of the present invention may adopt an embodiment in which a display element (for example, an organic EL element or a liquid crystal display element) and a circularly polarizing plate that is arranged on a viewing side of the display element. In addition, as described in detail later, in the display device, the slow axis of the phase difference film in the circularly polarizing plate satisfies a predetermined angular relationship with respect to the bending direction of the display device (display element).

As shown in FIGS. 3A to 3D described later, the display device of the present invention includes a display device in a bent state (a display device with fixed bending).

That is, the display device of the present invention may include the display element (for example, an organic EL element or a liquid crystal display element) that is bent (in one direction) and the circularly polarizing plate that is arranged on the viewing side of the display element, and the slow axis of the phase difference film in the circularly polarizing plate may satisfy a predetermined angular relationship with respect to the bending direction of the display device (display element), which will be described later.

At least a part of the display device is bent such that the radius of curvature is preferably 10 mm or less, more preferably 8 mm or less, and even more preferably 4 mm or less. In the display device in a bent state at such a very small radius of curvature, the reflectivity and reflective tint are reduced. More specifically, the display device is bent at any suitable portion. For example, the display device may be bent at the center portion like a folding type display device (for example, FIGS. 3A and 3B) or may be bent at the end portion form the viewpoint of securing designability and a display screen to the maximum extent (for example, FIGS. 3C and 3D). Further, as shown in FIGS. 3A to 3D, the display device may be bent in the longitudinal direction thereof or may be bent in the transverse direction thereof. Needless to say, a specific portion of the display device may be bent (for example, a part or all of four corners are bent in an oblique direction) according to the application.

Figure 4:
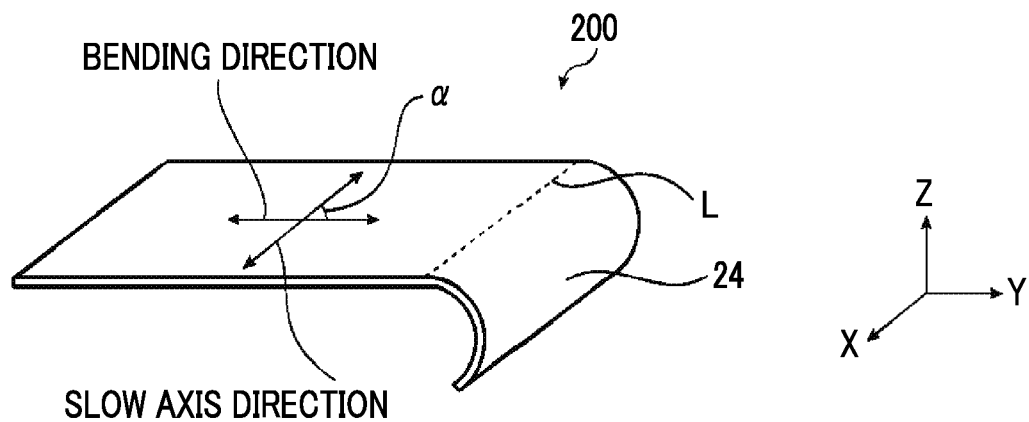
FIG. 4 is a schematic view showing an embodiment of the display device of the present invention.

The bending direction indicates a direction in which the display device is bent as shown in FIGS. 3A to 3D. The bending direction will be described in detail using FIG. 4. As shown in FIG. 4, a display device 200 has at least a flat portion 22, and a bent portion 24 that is connected to the flat portion 22 with (through) a linear bending starting line L (boundary line) interposed therebetween. In FIG. 4, the bending direction corresponds to a direction perpendicular to the linear bending starting line L (y direction in FIG. 4) in a case in which the display device 200 is observed in the normal direction of the flat portion 22 (z direction in FIG. 4). That is, in the display device having at least the flat portion and the bent portion that is connected to the flat portion with (through) a linear bending starting line L (boundary line) interposed therebetween, a direction perpendicular to the linear bending starting line corresponds to the bending direction.

The linear bending starting line L is positioned at the end portion of the flat portion 22 and is a position where bending starts.

As shown in FIGS. 3A to 3D, the slow axis direction of the phase difference film is adjusted to define an angle α with respect to the bending direction of the display element. Accordingly, the circularly polarizing plate is arranged on the display element in the display device such that the slow axis direction of the phase difference film in the circularly polarizing plate and the bending direction of the display device form the angle α.

The angle α is 75 to 105 degrees and preferably 80 to 100 degrees. By adjusting the slow axis direction of the phase difference film such that the angle α falls in this range, it is possible to suppress color variation caused by bending.

In the present specification, regarding the angle α, in a case in which the display device is observed from the polarizer side to the phase difference film side, the bending direction is set as a reference (0 degrees) and the counter-clockwise direction is expressed as a positive angle.

EXAMPLES

The features of the present invention will be described in more detail with reference to the following Examples and Comparative Examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

(1) Preparation of Optically Anisotropic Layer A
(Preparation of Cellulose Ester Solution A-1)
The following composition was put into a mixing tank and was stirred while being heated to dissolve the respective components, thereby preparing a cellulose ester solution A-1.

Composition of Cellulose Ester Solution A-1

| | |
|---|---|
| Cellulose acetate (acetalization degree: 2.86) | 100 parts by mass |
| Methylene chloride (first solvent) | 320 parts by mass |
| Methanol (second solvent) | 83 parts by mass |
| 1-Butanol (third solvent) | 3 parts by mass |
| Triphenyl phosphate | 7.6 parts by mass |
| Biphenyl diphenyl phosphate | 3.8 parts by mass |

(Preparation of Matting Agent Dispersion Liquid B-1)
The following composition was put into a dispersing machine and was stirred to dissolve the respective components, thereby preparing a matting agent dispersion liquid B-1.

Composition of Matting Agent Dispersion Liquid B-1

| | |
|---|---|
| Silica particle dispersion liquid (average particle diameter: 16 nm) "AEROSIL R972", manufactured by Nippon Aerosil Ltd. | 10.0 parts by mass |

| | |
|---|---|
| Methylene chloride | 72.8 parts by mass |
| Methanol | 3.9 parts by mass |
| Butanol | 0.5 parts by mass |
| Cellulose ester solution A-1 | 10.3 parts by mass |

(Preparation of Ultraviolet Absorbent Solution C-1)
The following composition was put into a mixing tank and was stirred while being heated to dissolve the respective components, thereby preparing an ultraviolet absorbent solution C-1.

Composition of Ultraviolet Absorbent Solution C-1

| | |
|---|---|
| Ultraviolet absorbent (UV-1 below) | 10.0 parts by mass |
| Ultraviolet absorbent (UV-2 below) | 10.0 parts by mass |
| Methylene chloride | 55.7 parts by mass |
| Methanol | 10 parts by mass |
| Butanol | 1.3 parts by mass |
| Cellulose ester solution A-1 | 12.9 parts by mass |

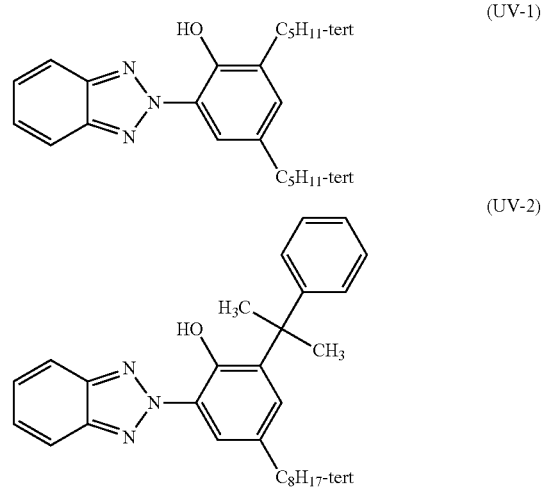

(Preparation of Cellulose Ester Film)
To a mixture obtained by mixing 94.6 parts by mass of the cellulose ester solution A-1 and 1.3 parts by mass of the matting agent dispersion liquid B-1, the ultraviolet absorbent solution C-1 was added such that the amounts of the respective ultraviolet absorbent (UV-1) and ultraviolet absorbent (UV-2) were 1.0 part by mass per 100 parts by mass of cellulose acylate. Thereafter, the mixture was fully stirred while being heated to dissolve the respective components, thereby preparing a dope. The obtained dope was heated to 30° C. and was allowed to pass through a casting Gieser, thereby casting the dope heated on a mirror surface stainless support which is a drum having a diameter of 3 m. The surface temperature of the mirror surface stainless support was set to −5° C. and the coating width was set to 1,470 mm. The film formed by casting the dope (dope film) was dried on the drum by dry air at 34° C. at 150 m³/min and in a state in which the residual solvent in the film was 150%, the film was peeled off from the drum. In a case in which the film was peeled off from the drum, the film was extended by 15% in the transport direction (longitudinal direction) of the film. Then, while holding the both ends of the film in the width direction (a direction perpendicular to the casting direction) with a pin tenter (the pin tenter described in FIG.

3 of JP1992-1009A (JP-H04-1009A)), the film was transported but was not stretched in the width direction of the film. Further, the film was further dried by transporting the film between rolls of a heat treatment device to prepare a cellulose acylate film (T1). The amount of the residual solvent of the prepared long cellulose acylate film (T1) was 0.2%, and the thickness of the cellulose acylate film was 40 µm, and Re and Rth at 550 nm were respectively 0.8 nm and 40 nm.

(Alkali Saponification Treatment)

The aforementioned cellulose acylate film (T1) was allowed to pass between induction heating rolls at a temperature of 60° C. to increase the surface temperature of the cellulose acylate film to 40° C. Then, an alkali solution of the following composition was applied to the band surface of the cellulose acylate film in a coating amount of 14 ml/m² using a bar coater. Next, the cellulose acylate film coated with the alkali solution was transported for 10 seconds under a steam type infrared ray heater (manufactured by NORITAKE Co., Limited) heated to 110° C. Subsequently, pure water was applied to the obtained cellulose acylate film in an amount of 3 ml/m² similarly using a bar coater. Next, the procedures of washing with water by a fountain coater and removing water by an air knife were repeatedly performed on the obtained cellulose acylate film 3 times. Thereafter, the obtained cellulose acylate film was transported to a 70° C. drying zone to be dried for 10 seconds, and thus a cellulose acylate film which had been subjected to an alkali saponification treatment was prepared.

Composition of Alkali Solution

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(Formation of Alignment Film)

An alignment film coating liquid (A) having the following composition was continuously applied to the surface of the cellulose acylate film (T1), which had been subjected to the alkali saponification treatment, using a #14 wire bar. Then, the cellulose acylate film coated with the alignment film coating liquid (A) was then dried for 60 seconds with hot air at 60° C. and further dried for 120 seconds with hot air at 100° C. Thus, an alignment film was formed.

Composition of Alignment Film Coating Liquid (A)

| | |
|---|---|
| Modified polyvinyl alcohol below | 10 parts by mass |
| Water | 308 parts by mass |
| Methanol | 70 parts by mass |
| Isopropanol | 29 parts by mass |
| Photopolymerization initiator (IRGACURE 2959, manufactured by BASF SE) | 0.8 parts by mass |

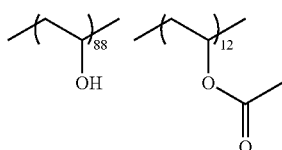

(Formation of Optically Anisotropic Layer A)

The prepared alignment film was continuously subjected to a rubbing treatment. At this time, the longitudinal direction of the long film was parallel to the transport direction and an angle formed between the longitudinal direction (transport direction) of the film and the rotation axis of the rubbing roller was 75 degrees (in a case in which the longitudinal direction (transport direction) of the film was set to 90 degrees and the counterclockwise direction was expressed as a positive value while setting the width direction of the film as a reference (0 degrees) by observing the film from the alignment film side, the angle of the rotation axis of the rubbing roller was 15°. In other words, the position of the rotation axis of the rubbing roller was a position where the rotation axis was rotated by 75 degrees on the basis of the longitudinal direction of the film).

An optically anisotropic layer coating liquid (A) including a discotic liquid crystal (DLC) compound and having the following composition was continuously applied to the alignment film subjected to the rubbing treatment using a #5.0 wire bar. The transport velocity (V) of the film was 26 m/min. In order to dry the solvent of the coating liquid and to align and age the discotic liquid crystal compound, the film coated with the optically anisotropic layer coating liquid (A) was heated for 90 seconds by hot air at 115° C. and subsequently heated for 60 seconds by hot air at 80° C. Then, ultraviolet (UV) irradiation (exposure amount: 70 mJ/cm²) was performed on the obtained film at a temperature of 80° C. and the alignment of the discotic liquid crystal compound was fixed to prepare an optically anisotropic layer A. The thickness of the optically anisotropic layer coating liquid A was 2.0 µm. It was confirmed that the average tilt angle with respect to the film surface of the disc plane of the DLC compound was 90 degrees and the DLC compound was aligned to be vertical to the film surface. In addition, in a case in which the angle of the slow axis was parallel to the rotation axis of the rubbing roller and the longitudinal direction of the film was set to 90 degrees (in a case in which the width direction was set to 0 degrees and the counterclockwise direction was expressed as a positive value while setting the width direction of the film as a reference (0 degrees) by observing the film from the alignment film side), the angle was −15 degrees. The obtained optically anisotropic layer coating liquid A corresponded to a λ/2 plate and Re(550) was 235 nm.

Composition of Optically Anisotropic Layer Coating Liquid (A)

| | |
|---|---|
| Discotic liquid crystal compound (A) below | 80 parts by mass |
| Discotic liquid crystal compound (B) below | 20 parts by mass |
| Ethylene oxide-modified trimethylolpropane triacrylate (V#360, manufactured by Osaka organic chemistry Co., Ltd.) | 5 parts by mass |
| Photopolymerization initiator (IRGACURE 907, manufactured by BASF SE) | 4 parts by mass |
| Pyridinium salt (A) below | 2 parts by mass |
| Polymer (A) below | 0.2 parts by mass |
| Polymer (B) below | 0.1 parts by mass |
| Polymer (C) below | 0.1 parts by mass |
| Methyl ethyl ketone | 211 parts by mass |

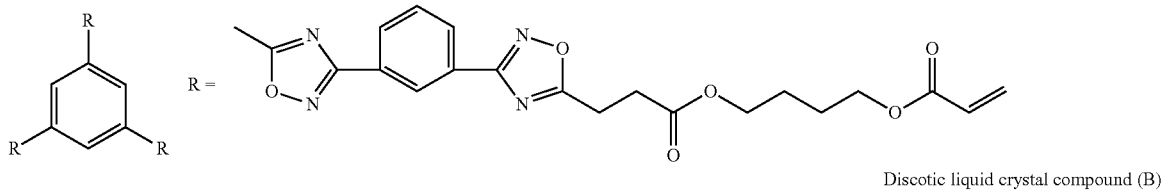

Discotic liquid crystal compound (A)

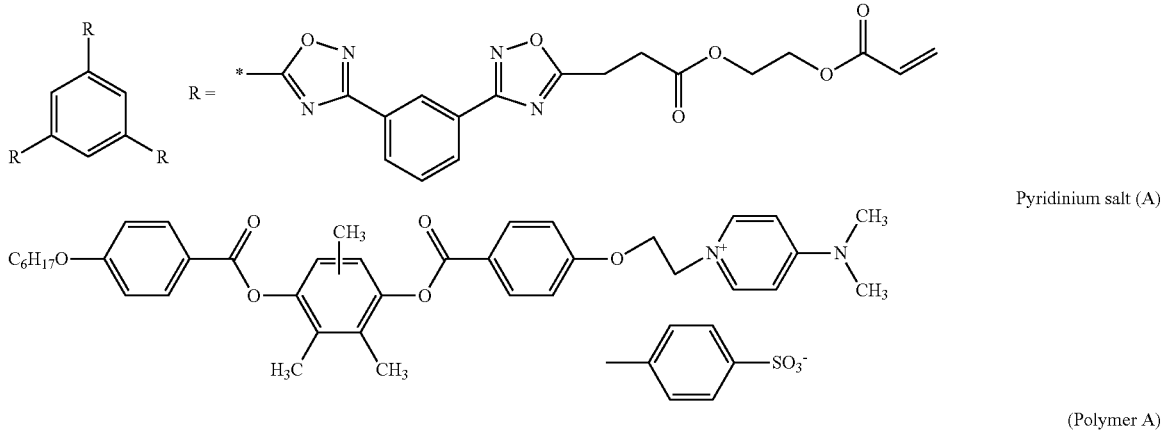

Discotic liquid crystal compound (B)

Pyridinium salt (A)

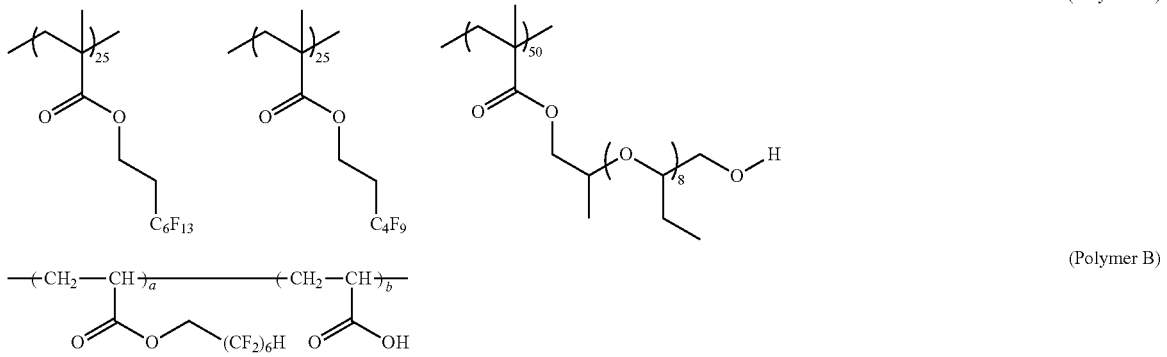

(Polymer A)

(Polymer B)

The above a represents 90 and the above b represents 10.

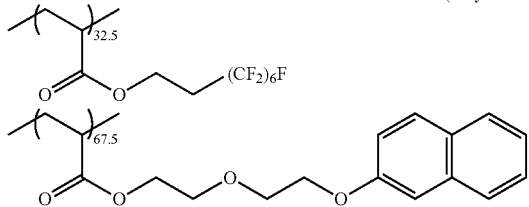

(Polymer C)

(2) Preparation of Optically Anisotropic Layer B
(Formation of Optically Anisotropic Layer B)

According to the same procedure as in (Formation of Optically Anisotropic Layer A) above, an alignment film was formed on the cellulose acylate film (T1) and the alignment film was continuously subjected to a rubbing treatment. At this time, the longitudinal direction of the long film was parallel to the transport direction and the angle formed between the longitudinal direction of the film (transport direction) and the rotation axis do the rubbing roller was set to 105 degrees (in a case in which the longitudinal direction (transport direction) of the film was set to 90 degrees and the counterclockwise direction was expressed as a positive value, while setting the width direction of the film as a reference by observing the film from the alignment film side, the rotation axis of the rubbing roller was 15 degrees, in other words, the position of the rotation axis of the rubbing roller was a position where the rotation axis was rotated by 105 degrees on the basis of the longitudinal direction of the film).

The optically anisotropic layer coating liquid (B) including the discotic liquid crystal compound having the following composition was continuously applied to the alignment film which had been subjected to a rubbing treatment using a #2.8 wire. The transport velocity (V) of the film was 26 m/min. In order to dry the solvent of the coating liquid and to align and age the discotic liquid crystal compound, the film coated with the optically anisotropic layer coating liquid (B) was heated for 60 seconds by hot air at 60° C. Thereafter, UV irradiation was performed on the obtained film at 60° C. and the alignment of the discotic liquid crystal compound was fixed to prepare an optically anisotropic layer B. The thickness of the optically anisotropic layer B was 0.8 µm. It was confirmed that the average tilt angle of the major axis of the discotic liquid crystal compound with respect to the film surface was 90 degrees and the discotic liquid crystal compound was aligned to be vertical to the film surface. In addition, in a case in which the slow axis was perpendicular to the rotation axis of the rubbing roller and the longitudinal direction of the film was set to 90 degrees (in a case in which the width direction of the film was set to 0 degrees and the counterclockwise direction was expressed as a positive value while setting the width direction of the film as a reference (0 degrees) by observing the film from the alignment film side), the angle of the slow axis was −75 degrees. The obtained optically anisotropic layer B corresponded to a λ/4 plate and Re(550) was 117.5 nm.

Composition of Optically Anisotropic Layer Coating Liquid (B)

| | |
|---|---|
| Discotic liquid crystal compound (A) above | 80 parts by mass |
| Discotic liquid crystal compound (B) above | 20 parts by mass |
| Ethylene oxide-modified trimethylolpropane triacrylate (V#360, manufactured by Osaka organic chemistry Co., Ltd.) | 10 parts by mass |
| Photopolymerization initiator (IRGACURE 907, manufactured by BASF SE) | 5 parts by mass |
| Pyridinium salt (A) below | 1 part by mass |
| Polymer (A) above | 0.2 parts by mass |
| Polymer (B) above | 0.1 parts by mass |
| Polymer (C) above | 0.1 parts by mass |
| Methyl ethyl ketone | 348 parts by mass |

(3) Preparation of Positive C-Plate (Optically Anisotropic Layer C)

(Preparation of Peelable Support)

An alignment film was prepared in the following manner without performing the alkali saponification treatment on the cellulose acylate film and thus a peelable support was prepared.

(Formation of Alignment Film)

An alignment film coating liquid (B) having the following composition was continuously applied to the cellulose acylate film using a #14 wire bar. The cellulose acylate film coated with the alignment film coating liquid (B) was dried for 60 seconds by hot air at 60° C. and further dried for 120 seconds by hot air of 100° C. Thus, an alignment film was formed.

Composition of Alignment Film Coating Liquid (B)

| | |
|---|---|
| Modified polyvinyl alcohol-2 blow | 10 parts by mass |
| Water | 371 parts by mass |
| Methanol | 119 parts by mass |
| Glutaraldehyde (crosslinking agent) | 0.5 parts by mass |
| Citric acid ester (AS3, manufactured by Sankyo Chemical Industry Co., Ltd.) | 0.175 parts by mass |
| Photopolymerization initiator (IRGACURE 2959, manufactured by BASF SE) | 2.0 parts by mass |

[Modified Polyvinyl Alcohol-2]

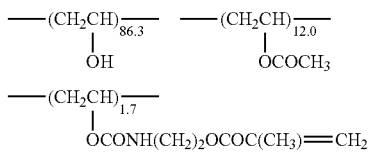

An optically anisotropic layer coating liquid (C) including a rod-like liquid crystal compound having the following composition was continuously applied to the prepared alignment film using a #5.0 wire bar. The transport velocity (V) of the film was 26 m/min. In order to dry the solvent of the coating liquid and to align and age the rod-like liquid crystal compound, the film coated with the optically anisotropic layer coating liquid (C) was heated for 60 seconds by hot air at 60° C. Then, UV irradiation was performed on the obtained film at 60° C. and the alignment of the rod-like liquid crystal compound was fixed to prepare a positive C-plate.

In a case of preparing the positive C-plate, three types of positive C-plates were prepared by changing the thickness of the positive C-plate.

First, the thickness of a first positive C-plate was 0.5 μm and Rth(550) was −50 nm.

The thickness of a second positive C-plate was 1.0 μm and Rth(550) was −100 nm.

The thickness of a third positive C-plate was 2.0 μm and Rth(550) was −150 nm.

Composition of Optically Anisotropic Layer Coating Liquid (C)

| | |
|---|---|
| Rod-like liquid crystal compound-1 | 80 parts by mass |
| Rod-like liquid crystal compound-2 | 20 parts by mass |
| Photopolymerization initiator (IRGACURE 907, manufactured by BASF SE) | 3 parts by mass |
| Sensitizer (KAYACURE DETX, manufactured by Nippon Kayaku Co., Ltd.) | 1 part by mass |
| Fluorine-containing compound (FP-2) | 0.3 parts by mass |
| Alignment film interface aligning agent-1 | 0.55 parts by mass |
| Methyl ethyl ketone | 193 parts by mass |

[Rod-Like Liquid Crystal Compound-1]

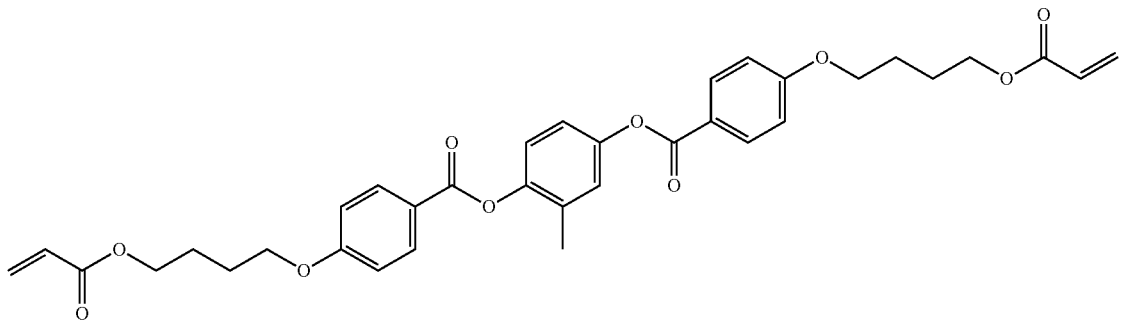

[Rod-Like Liquid Crystal Compound-2]

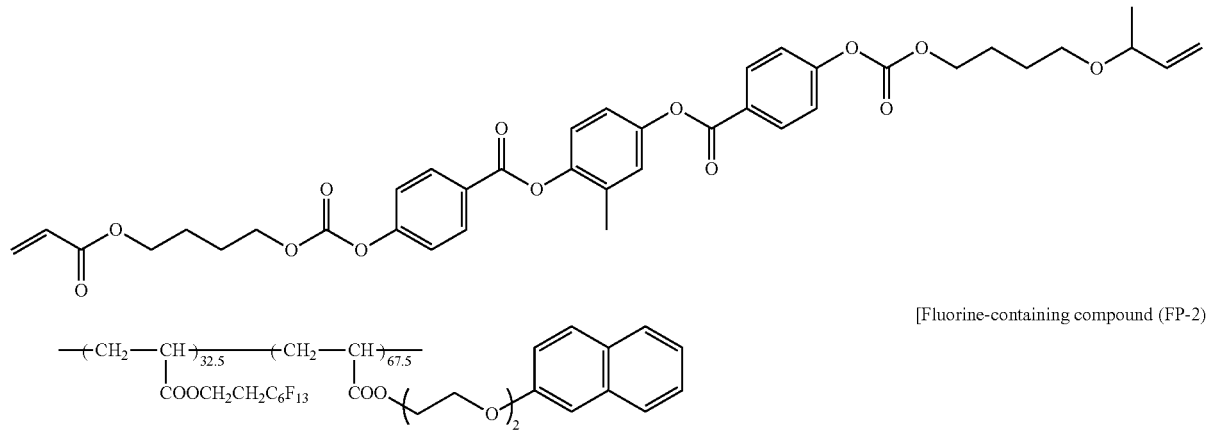

[Fluorine-containing compound (FP-2)]

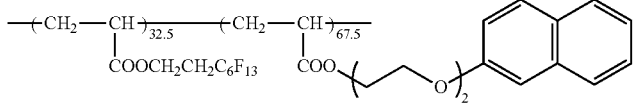

(4) Preparation of Polarizer

A polyvinyl alcohol (PVA) film having a thickness of 80 μm was dyed by immersing the film in an aqueous iodine solution having an iodine concentration of 0.05% by mass for 60 seconds at 30° C. Then, the dyed film was longitudinally stretched 5 times the original length while being immersed in an aqueous boric acid solution having a boric acid concentration of 4% by mass for 60 seconds, and then dried at 50° C. for 4 minutes. Thus, a polarizer having a thickness of 20 μm was obtained.

A commercially available cellulose acylate-based film "TD40UC" (manufactured by Fuji Film Corporation) was prepared and immersed in an aqueous sodium hydroxide solution (1.5 mol/liter) at 55° C. Thereafter, the cellulose acylate-based film was fully washed with water to remove sodium hydroxide on the film. After the cellulose acylate-based film was immersed in an aqueous diluted sulfuric acid solution (0.005 mol/liter) at 35° C. for 1 minute, the film was immersed in water and fully washed therein to remove the aqueous diluted sulfuric acid solution. Thereafter, the obtained cellulose acylate-based film was fully dried at 120° C. to prepare a polarizer protective film.

The prepared polarizer protective films were attached to both surfaces of the prepared polarizer with a polyvinyl alcohol-based adhesive and thus a polarizing plate including the polarizer and the polarizer protective films arranged on both surfaces of the polarizer was prepared.

Example 1

A pressure sensitive adhesive (SK-2057, manufactured by Soken Chemical & Engineering Co., Ltd.) was applied to on the above-prepared polarizer protective film in the polarizing plate to form a pressure sensitive adhesive layer. Next, the polarizing plate in which the pressure sensitive adhesive layer was arranged, and the film having the cellulose acylate film, the alignment film, and the optically anisotropic layer A prepared above were laminated such that the pressure sensitive adhesive layer and the optically anisotropic layer A were made to adhere to each other. Then, the cellulose acylate film and the alignment film were peeled off from the obtained laminate to obtain a laminate.

Further, the pressure sensitive adhesive (SK-2057, manufactured by Soken Chemical & Engineering Co., Ltd.) was applied to the optically anisotropic layer A in the obtained laminate to form a pressure sensitive adhesive layer. Next, the polarizing plate in which the pressure sensitive adhesive layer was arranged and the film having the cellulose acylate film, the alignment film, and the optically anisotropic layer B prepared above were laminated such that the pressure sensitive adhesive layer and the optically anisotropic layer B were made to adhere to each other. Then, the cellulose acylate film and the alignment film were peeled off from the obtained laminate.

Through the above procedure, a circularly polarizing plate X in which the polarizer, the optically anisotropic layer A (λ/2 plate), and the optically anisotropic layer B (λ/4 plate) were arranged in this order was prepared. In a case in which the counterclockwise direction was expressed as a positive value while setting the transmission axis of the polarizer as a reference (0 degrees) by observing the film from the polarizer side, the angle of the transmission axis of the λ/2 plate was −15 degrees and the angle of the transmission axis of the λ/4 plate was −75 degrees.

That is, the angle formed between the slow axis of the optically anisotropic layer A (λ/2 plate) and the transmission axis of the polarizer was 15 degrees and the angle formed between the slow axis of the optically anisotropic layer A (λ/2 plate) and the slow axis of the optically anisotropic layer B (λ/4 plate) was 60 degrees.

Figure 5:
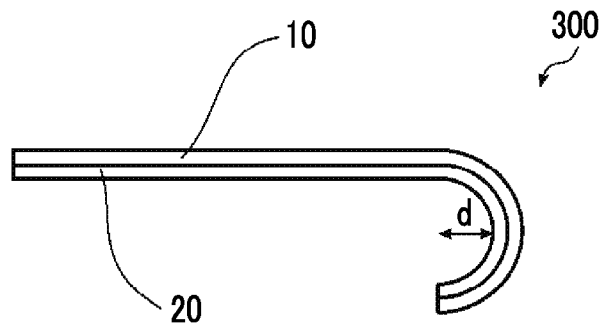
FIG. 5 is a schematic cross-sectional view shown a display device prepared in Example 1.

As shown in FIG. 5, the above-prepared circularly polarizing plate was laminated on the organic EL element 20 having a radius of curvature of d=7 mm with SK2057 (manufactured by Soken Chemical & Engineering Co., Ltd.) such that the polarizer in the circularly polarizing plate 10 was disposed on the viewing side and the optically anisotropic layer B was disposed on the organic EL element 20 side. Thus, a display device 300 was prepared.

In the above-prepared display device, the slow axis direction of the phase difference film was adjusted to an angle of 90 degrees with respect to the bending direction of the display device. The slow axis of the phase difference film means the slow axis of the entire phase difference film including the optically anisotropic layer A and the optically anisotropic layer B. The slow axis direction of the phase difference film was measured with KOBRA 21ADH.

<Evaluation>

(Evaluation of Reflectivity and Reflective Tint at 45 Degrees)

Figure 6:
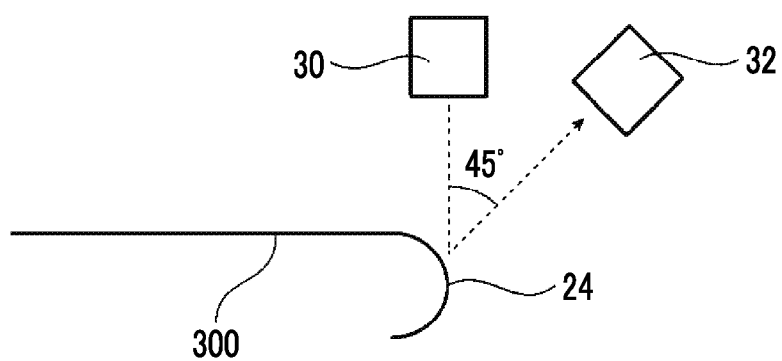
FIG. 6 is a schematic view showing a method of evaluation of reflectivity and reflective tint at 45 degrees.

As shown in FIG. 6, SR-3 (manufactured by TOPCON Corporation) 32 was fixed to the bent portion 24 of the above-prepared display device 300 at an inclination of 45 degrees and the reflectivity and tint (a*/b*) were measured under a fluorescent lamp 30. The reflective tint (RC) was defined from the obtained tint (a*/b*) by Expression (1).

$$RC=\{(a^*)^2+(b^*)^2\}^{0.5} \quad \text{(Expression 1)}$$

RC represents a distance from the origin in a color coordinate space, and as the value of RC decreases, the tint of the reflected light decreases, which represents high black color reproducibility. The results are shown in Table 1.

In practical use, the reflectivity is preferably 6.0% or less and the reflective tint is preferably 9 or less.

(Evaluation of Bending Resistance)

In accordance to cylindrical mandrel test Type 2 described in JIS-K5600-5-1 (a test in which a sample is wounded around a metal cylinder), the above-prepared circularly polarizing plate X was wounded around a cylindrical rod and the minimum diameter (mm) of the cylindrical rod at which cracking did not occur was evaluated. The result is shown in Table 1.

Example 2

A display device was prepared in the same procedure as in Example 1 except that the angle of the slow axis direction of the phase difference film with respect to the bending direction of the display device was changed from 90 degrees to 75 degrees, and various evaluations were performed. The results are shown in Table 1.

Example 3

A display device was prepared in the same procedure as in Example 1 except that the angle of the slow axis direction of the phase difference film with respect to the bending direction of the display device was changed from 90 degrees to 85 degrees, and various evaluations were performed. The results are shown in Table 1.

Example 4

A display device was prepared in the same procedure as in Example 1 except that the angle of the slow axis direction of the phase difference film with respect to the bending direction of the display device was changed from 90 degrees to 95 degrees, and various evaluations were performed. The results are shown in Table 1.

Example 5

A display device was prepared in the same procedure as in Example 1 except that the angle of the slow axis direction of the phase difference film with respect to the bending direction of the display device was changed from 90 degrees to 105 degrees, and various evaluations were performed. The results are shown in Table 1.

Example 6

A display device was prepared in the same procedure as in Example 1 except that a circularly polarizing plate Y prepared in the following procedure was used instead of the circularly polarizing plate X, and various evaluations were performed. The results are shown in Table 1.

(Preparation of Circularly Polarizing Plate Y)

An optically anisotropic layer A1 was prepared in the same procedure as in Example 1 except that the slow axis direction of the optically anisotropic layer A was changed from −15 degrees to 15 degrees.

Next, a pressure sensitive adhesive (SK-2057, manufactured by Soken Chemical & Engineering Co., Ltd.) was applied to the polarizer protective film in the above-prepared polarizing plate to form a pressure sensitive adhesive layer. Next, the polarizing plate in which the pressure sensitive adhesive layer was arranged and the film having the cellulose acylate film, the alignment film, and the optically anisotropic layer A1 prepared above were laminated such that the pressure sensitive adhesive layer and the cellulose acylate film were made to adhere to each other to obtain a laminate.

Further, the pressure sensitive adhesive (SK-2057, manufactured by Soken Chemical & Engineering Co., Ltd.) was applied to the optically anisotropic layer A1 in the laminate to form a pressure sensitive adhesive layer. Next, the laminate in which the pressure sensitive adhesive layer was arranged and the film having the cellulose acylate film, the alignment film, and the optically anisotropic layer B prepared above were laminated such that the pressure sensitive adhesive layer and the optically anisotropic layer B were made to adhere to each other to obtain a laminate. Then, the cellulose acylate film and the alignment film were peeled off from the obtained laminate.

Through the above procedure, a circularly polarizing plate Y in which the polarizer, the optically anisotropic layer A1 (λ/2 plate), and the optically anisotropic layer B (λ/4 plate) were arranged in this order was prepared. In the circularly polarizing plate Y, the cellulose acylate film was included between the polarizer and the optically anisotropic layer A1. In addition, in the circularly polarizing plate Y, the relationships among the transmission axis of the polarizer, the slow axis of the optically anisotropic layer A1, and the slow axis of the optically anisotropic layer B were the same as in circularly polarizing plate X.

Example 7

A display device was prepared in the same procedure as in Example 1 except that a circularly polarizing plate Z prepared in the following procedure was used instead of the circularly polarizing plate X, and various evaluations were performed. The results are shown in Table 1.

(Preparation of Circularly Polarizing Plate Z)

An optically anisotropic layer A1 was prepared in the same procedure as in Example 1 except that the slow axis direction of the optically anisotropic layer A was changed from −15 degrees to 15 degrees.

In addition, an optically anisotropic layer B1 was prepared in the same procedure as in Example 1 except that the slow axis direction of the optically anisotropic layer B was changed from −75 degrees to 75 degrees.

Next, a pressure sensitive adhesive (SK-2057, manufactured by Soken Chemical & Engineering Co., Ltd.) was applied to the polarizer protective film in the above-prepared polarizing plate to form a pressure sensitive adhesive layer. Next, the polarizing plate in which the pressure sensitive adhesive layer was arranged and the film having the cellulose acylate film, the alignment film, and the optically anisotropic layer A1 prepared above were laminated such that the pressure sensitive adhesive layer and the cellulose acylate film were made to adhere to each other to obtain a laminate.

Further, the pressure sensitive adhesive (SK-2057, manufactured by Soken Chemical & Engineering Co., Ltd.) was applied to the optically anisotropic layer A1 in the laminate to form a pressure sensitive adhesive layer. Next, the laminate in which the pressure sensitive adhesive layer was arranged and the film having the cellulose acylate film, the alignment film, and the optically anisotropic layer B1 prepared above were laminated such that the pressure sensitive adhesive layer and the cellulose acylate film were made to adhere to each other.

Through the above procedure, a circularly polarizing plate Z in which the polarizer, the optically anisotropic layer A1 (λ/2 plate), and the optically anisotropic layer B1 (λ/4 plate) were arranged in this order was prepared. In the circularly polarizing plate Z, the cellulose acylate films were included between the polarizer and the optically anisotropic layer A1, and between the optically anisotropic layer A1 and the optically anisotropic layer B1. In addition, in the circularly polarizing plate Z, the relationships among the transmission axis of the polarizer, the slow axis of the optically anisotropic layer A1, and the slow axis of the optically anisotropic layer B1 were the same as in the circularly polarizing plate X.

Example 8

A display device was prepared in the same procedure as in Example 1 except that a circularly polarizing plate V prepared in the following procedure was used instead of the circularly polarizing plate X, and various evaluations were performed. The results are shown in Table 1.

(Preparation of Circularly Polarizing Plate V)

A pressure sensitive adhesive (SK-2057, manufactured by Soken Chemical & Engineering Co., Ltd.) was applied to the optically anisotropic layer B in the circularly polarizing plate X to form a pressure sensitive adhesive layer. Next, the polarizing plate in which the pressure sensitive adhesive layer was arranged and the film having the cellulose acylate film and the first positive C-plate prepared above were laminated such that the pressure sensitive adhesive layer and the first positive C-plate were made to adhere to each other. Then, the cellulose acylate film was peeled off from the obtained laminate to prepare a circularly polarizing plate V.

Example 9

A display device was prepared in the same procedure as in Example 1 except that a circularly polarizing plate W prepared in the following procedure was used instead of the circularly polarizing plate X, and various evaluations were performed. The results are shown in Table 1.

(Preparation of Circularly Polarizing Plate W)

A pressure sensitive adhesive (SK-2057, manufactured by Soken Chemical & Engineering Co., Ltd.) was applied to the optically anisotropic layer B in the circularly polarizing plate X to form a pressure sensitive adhesive layer. Next, the polarizing plate in which the pressure sensitive adhesive layer was arranged and the film having the cellulose acylate film and the second positive C-plate prepared above were laminated such that the pressure sensitive adhesive layer and the second positive C-plate were made to adhere to each other. Then, the cellulose acylate film was peeled off from the obtained laminate to prepare a circularly polarizing plate W.

Example 10

A display device was prepared in the same procedure as in Example 1 except that a circularly polarizing plate P prepared in the following procedure was used instead of the circularly polarizing plate X, and various evaluations were performed. The results are shown in Table 1.

(Preparation of Circularly Polarizing Plate P)

A pressure sensitive adhesive (SK-2057, manufactured by Soken Chemical & Engineering Co., Ltd.) was applied to the optically anisotropic layer B in the circularly polarizing plate X to form a pressure sensitive adhesive layer. Next, the polarizing plate in which the pressure sensitive adhesive layer was arranged and the film having the cellulose acylate film and the third positive C-plate prepared above were laminated such that the pressure sensitive adhesive layer and the third positive C-plate were made to adhere to each other. Then, the cellulose acylate film was peeled off from the obtained laminate to prepare a circularly polarizing plate P.

Comparative Example 1

A display device was prepared in the same procedure as in Example 1 except that the angle of the slow axis direction of the phase difference film with respect to the bending direction of the display device was changed from 90 degrees to 0 degrees, and various evaluations were performed. The results are shown in Table 1.

Comparative Example 2

A display device was prepared in the same procedure as in Example 1 except that the angle of the slow axis direction of the phase difference film with respect to the bending direction of the display device was changed from 90 degrees to 150 degrees, and various evaluations were performed. The results are shown in Table 1.

Comparative Example 3

A display device was prepared in the same procedure as in Example 1 except that a circularly polarizing plate described in Example 2 of JP2014-170221A was used instead of the circularly polarizing plate X, and the angle of the slow axis direction of the phase difference film with respect to the bending direction of the display device was changed from 90 degrees to 0 degrees, and various evaluations were performed. The results are shown in Table 1. In Table 1, the term "modified PC" means "modified polycarbonate".

Comparative Example 4

A display device was prepared in the same procedure as in Example 1 except that a circularly polarizing plate described in Example 2 of JP2014-170221A was used instead of the circularly polarizing plate X, and the angle of the slow axis direction of the phase difference film with respect to the bending direction of the display device was changed from 90 degrees to 45 degrees, and various evaluations were performed. The results are shown in Table 1.

In Table 1 below, in the column "Support" of the column "Optically anisotropic layer A (or A1)", a case in which the cellulose acylate film is provided between the polarizer and the optically anisotropic layer A (or A1) is expressed as "Provided" and a case in which the cellulose acylate film is not provided between the polarizer and the optically anisotropic layer A (or A1) is expressed as "Not provided".

In Table 1, in the column "Support" of the column "Optically anisotropic layer B (or B1)", a case in which the cellulose acylate film is provided between the optically anisotropic layer A (or A1) and the optically anisotropic layer B (or B1) is expressed as "Provided" and a case in which the cellulose acylate film is not provided between the optically anisotropic layer A (or A1) and the optically anisotropic layer B (or B1) is expressed as "Not provided".

In Table 1, the term "Circularly polarizing plate laminating angle" represents an angle of the slow axis direction of the phase difference film with respect to the bending direction of the display device.

As described above, the optically anisotropic layer A1 is used in Examples 6 and 7 and the optically anisotropic layer B1 is used in Example 7.

TABLE 1

| | Embodiment | | | | | | | | |
|---|---|---|---|---|---|---|---|---|---|
| | | Layer configuration | | | | Circularly | Evaluation result | | |
| | | Optically anisotropic layer A (or A1) | | Optically anisotropic layer B (or B1) | | Optically anisotropic | polarizing plate | Reflective | | |
| | Used material | Support | Phase difference [nm] | Support | Phase difference [nm] | layer C Rth [nm] | laminating angle [°] | Reflectivity at 45° [%] | tint (RC) [-] | Bending resistance [mm] |
| Example 1 | Liquid crystal compound | Not provided | 235 | Not provided | 117.5 | — | 90 | 4.7 | 3.5 | 2 |
| Example 2 | Liquid crystal compound | Not provided | 235 | Not provided | 117.5 | — | 75 | 5.7 | 5.8 | 2 |
| Example 3 | Liquid crystal compound | Not provided | 235 | Not provided | 117.5 | — | 85 | 4.9 | 3.5 | 2 |
| Example 4 | Liquid crystal compound | Not provided | 235 | Not provided | 117.5 | — | 95 | 4.8 | 5.2 | 2 |
| Example 5 | Liquid crystal compound | Not provided | 235 | Not provided | 117.5 | — | 105 | 5.1 | 9 | 2 |
| Example 6 | Liquid crystal compound | Provided | 235 | Not provided | 117.5 | — | 90 | 4.6 | 3.6 | 3 |
| Example 7 | Liquid crystal compound | Provided | 235 | Provided | 117.5 | — | 90 | 4.5 | 3.3 | 4 |
| Example 8 | Liquid crystal compound | Not provided | 235 | Not provided | 117.5 | −50 | 90 | 4.3 | 3.5 | 2 |
| Example 9 | Liquid crystal compound | Not provided | 235 | Not provided | 117.5 | −100 | 90 | 4.1 | 3.5 | 2 |
| Example 10 | Liquid crystal compound | Not provided | 235 | Not provided | 117.5 | −150 | 90 | 4.2 | 3.5 | 2 |
| Comparative Example 1 | Liquid crystal compound | Not provided | 235 | Not provided | 117.5 | — | 0 | 4.7 | 14.9 | 2 |
| Comparative Example 2 | Liquid crystal compound | Not provided | 235 | Not provided | 117.5 | — | 150 | 6.2 | 9.0 | 2 |
| Comparative Example 3 | Modified PC | | 275 | | — | — | 0 | 8.5 | 14.0 | 6 |
| Comparative Example 4 | Modified PC | | 275 | | — | — | 45 | 7.2 | 5.0 | 5 |

As shown in Table 1, the circularly polarizing plate of the present invention exhibited desired effects.

Among these, from the comparison of Examples 1 to 5, it was confirmed that in a case in which the angle of the slow axis direction of the phase difference film with respect to the bending direction of the display device was 80 to 100 degrees, further excellent effects could be obtained.

In addition, from the comparison of Examples 1 and 8 to 10, it was confirmed that in a case in which a predetermined positive C-plate was included, the reflectivity was further reduced.

On the other hand, in Comparative Examples 1 and 2, in which the slow axis direction of the phase difference film and the bending direction of the display device did not satisfy a predetermined relationship, and Comparative Examples 3 and 4 in which the phase difference film used in JP2014-170221A was used, predetermined effects could not be obtained.

EXPLANATION OF REFERENCES

10: circularly polarizing plate
12: polarizer
14: phase difference film
16: λ/2 plate
18: λ/4 plate
20: organic EL element
22: flat portion
24: bent portion
30: fluorescent lamp
32: SR-3 (manufactured by TOPCON Corporation)
100, 200, 300: display device
L: boundary line

What is claimed is:

1. A circularly polarizing plate used for a bendable display device, comprising:
    a polarizer; and
    a phase difference film that is arranged on one side of the polarizer,
    wherein the phase difference film includes a λ/2 plate and a λ/4 plate,
    the λ/2 plate and the λ/4 plate each include a liquid crystal compound, and
    a slow axis direction of the phase difference film is adjusted to define an angle of 75 to 105 degrees with respect to a bending direction of the display device.

2. The circularly polarizing plate according to claim 1, wherein the slow axis direction of the phase difference film is adjusted to define an angle of 80 to 100 degrees with respect to the bending direction of the display device.

3. The circularly polarizing plate according to claim 1, wherein the phase difference film further includes a positive C-plate having a retardation in a thickness direction at a wavelength of 550 nm of −150 to −50 nm.

4. The circularly polarizing plate according to claim 1, wherein the display device is an organic electroluminescence display device.

5. A bendable display device comprising:
the circularly polarizing plate according to claim 1.

6. The circularly polarizing plate according to claim 2, wherein the phase difference film further includes a positive C-plate having a retardation in a thickness direction at a wavelength of 550 nm of −150 to −50 nm.

7. The circularly polarizing plate according to claim 2, wherein the display device is an organic electroluminescence display device.

8. The circularly polarizing plate according to claim 3, wherein the display device is an organic electroluminescence display device.

9. A bendable display device comprising:
the circularly polarizing plate according to claim 2.

10. A bendable display device comprising:
the circularly polarizing plate according to claim 3.

11. A bendable display device comprising:
the circularly polarizing plate according to claim 4.

* * * * *